(12) United States Patent
Kim et al.

(10) Patent No.: US 11,076,482 B2
(45) Date of Patent: Jul. 27, 2021

(54) PRINTED CIRCUIT BOARD

(71) Applicant: SAMSUNG ELECTRO-MECHANICS CO., LTD., Suwon-si (KR)

(72) Inventors: Jung Soo Kim, Suwon-si (KR); Ha Il Kim, Suwon-si (KR); Seok Jun Ahn, Suwon-si (KR); Soo Ah Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/849,622

(22) Filed: Apr. 15, 2020

(65) Prior Publication Data
US 2021/0185806 A1 Jun. 17, 2021

(30) Foreign Application Priority Data
Dec. 12, 2019 (KR) .......................... 10-2019-0165447

(51) Int. Cl.
*H05K 1/02* (2006.01)
*H05K 1/11* (2006.01)
*H05K 1/18* (2006.01)

(52) U.S. Cl.
CPC .......... *H05K 1/0298* (2013.01); *H05K 1/116* (2013.01); *H05K 1/118* (2013.01); *H05K 1/0278* (2013.01); *H05K 1/181* (2013.01)

(58) Field of Classification Search
CPC ...... H05K 1/0298; H05K 1/116; H05K 1/118; H05K 1/181
See application file for complete search history.

(56) References Cited

U.S. PATENT DOCUMENTS

| 5,206,463 | A | * | 4/1993 | DeMaso | .............. H05K 3/4691 174/254 |
| 5,616,888 | A | * | 4/1997 | McLaughlin | .......... H05K 7/205 174/260 |
| 8,395,054 | B2 | * | 3/2013 | Kariya | .............. H01L 23/49827 174/260 |

(Continued)

FOREIGN PATENT DOCUMENTS

JP H08-236912 A 9/1996
KR 10-2014-0010778 A 1/2014

*Primary Examiner* — Ishwarbhai B Patel
(74) *Attorney, Agent, or Firm* — Morgan, Lewis & Bockius LLP

(57) ABSTRACT

A printed circuit board includes an internal insulating layer, an internal conductive pattern layer disposed on the internal insulating layer and including a line portion and a bonding pad portion, and an external insulating layer disposed on the internal conductive pattern layer and the internal insulating layer and having an accommodation groove extending therethrough to expose the bonding pad portion. The bonding pad portion includes a connection pattern extending from the line portion of the internal conductive pattern layer embedded in the external insulating layer, and exposed to the accommodation groove; a land pattern disposed closer to a center portion of the accommodation groove than the connection pattern; and a dam pattern connecting the connection pattern and the land pattern, in which a line width of the dam pattern is narrower than a line width of the land pattern.

19 Claims, 5 Drawing Sheets

(56) References Cited

U.S. PATENT DOCUMENTS

| | | | | |
|---|---|---|---|---|
| 10,321,560 | B2* | 6/2019 | Yu | H05K 3/4691 |
| 2003/0141596 | A1* | 7/2003 | Nakamura | H01L 25/0657 |
| | | | | 257/758 |
| 2004/0200638 | A1* | 10/2004 | Lee | H05K 3/243 |
| | | | | 174/257 |
| 2006/0220242 | A1* | 10/2006 | Kawamura | H01L 23/4985 |
| | | | | 257/737 |
| 2008/0047135 | A1* | 2/2008 | Arnold | H05K 3/4691 |
| | | | | 29/829 |
| 2009/0011617 | A1* | 1/2009 | Ebe | H05K 1/111 |
| | | | | 439/55 |
| 2010/0252308 | A1* | 10/2010 | Nakai | H05K 1/0216 |
| | | | | 174/255 |
| 2011/0075374 | A1* | 3/2011 | Kang | H05K 3/4691 |
| | | | | 361/704 |
| 2013/0020120 | A1* | 1/2013 | Ishihara | H05K 3/4697 |
| | | | | 174/262 |
| 2015/0114690 | A1* | 4/2015 | Ishihara | H05K 3/4691 |
| | | | | 174/251 |

* cited by examiner

PRINTED CIRCUIT BOARD

CROSS-REFERENCE TO RELATED APPLICATION(S)

This application claims benefit of priority to Korean Patent Application No. 10-2019-0165447 filed on Dec. 12, 2019 in the Korean Intellectual Property Office, the disclosure of which is incorporated herein by reference in its entirety.

BACKGROUND

1. Field

The present disclosure relates to a printed circuit board.

2. Description of Related Art

Recently, demand for a display device such as a tablet PC, a smartphone, or the like, has increased.

In the case of a display device, a rigid flexible printed circuit board having flexibility may be often used due to the limitation of the internal layout space, or the like.

In mounting electronic components, and the like, on a printed circuit board, a bonding pad of the board and a bump pad of the components may be connected by a thermal compression (TC) bonding process. In this regard, when variations in amounts of solder flow generated for each bonding pad in a solder reflow process are high, a problem of reliability for a connection between the bonding pad and the bump pad may occur.

SUMMARY

An aspect of the present disclosure is to improve reliability for connections between a printed circuit board and an electronic component.

According to an aspect of the present disclosure, a printed circuit board may include an internal insulating layer, an internal conductive pattern layer disposed on the internal insulating layer and including a line portion and a bonding pad portion, and an external insulating layer disposed on the internal conductive pattern layer and the internal insulating layer and having an accommodation groove extending therethrough to expose the bonding pad portion. The bonding pad portion may include a connection pattern extending from the line portion of the internal conductive pattern layer embedded in the external insulating layer, and extending in the accommodation groove; a land pattern disposed closer to a center portion of the accommodation groove than the connection pattern; and a dam pattern connecting the connection pattern and the land pattern, in which a line width of the dam pattern is narrower than a line width of the land pattern.

According to another aspect of the present disclosure, a printed circuit board includes an internal insulating layer having a flexible region and a rigid region, and an external insulating layer disposed in the rigid region. The printed circuit board includes an internal conductive pattern layer disposed on the internal insulating layer and including a line portion and a bonding pad portion both disposed in the rigid region, where the external insulating layer has an accommodation groove passing therethrough to expose the bonding pad portion. The bonding pad portion has one region disposed in a central portion of the accommodation groove, and another region extending from the one region to be connected to the line portion, in which at least a portion of a line width of the other region of the bonding pad portion is narrower than a line width of the one region of the bonding pad portion.

According to a further aspect of the present disclosure, a printed circuit board includes a first insulating layer, a conductive pattern disposed on the first insulating layer, and a second insulating layer disposed on the conductive pattern and the first insulating layer. A bonding pad portion of the conductive pattern is exposed through an opening in the second insulating layer, and the bonding pad portion of the conductive pattern includes a connection pattern extending in the opening in the second insulating layer from the conductive pattern layer embedded in the second insulating layer; a land pattern disposed closer to a center portion of the opening in the second insulating layer than the connection pattern; and a dam pattern connecting the connection pattern and the land pattern and having a line width narrower than a line width of the connection pattern.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
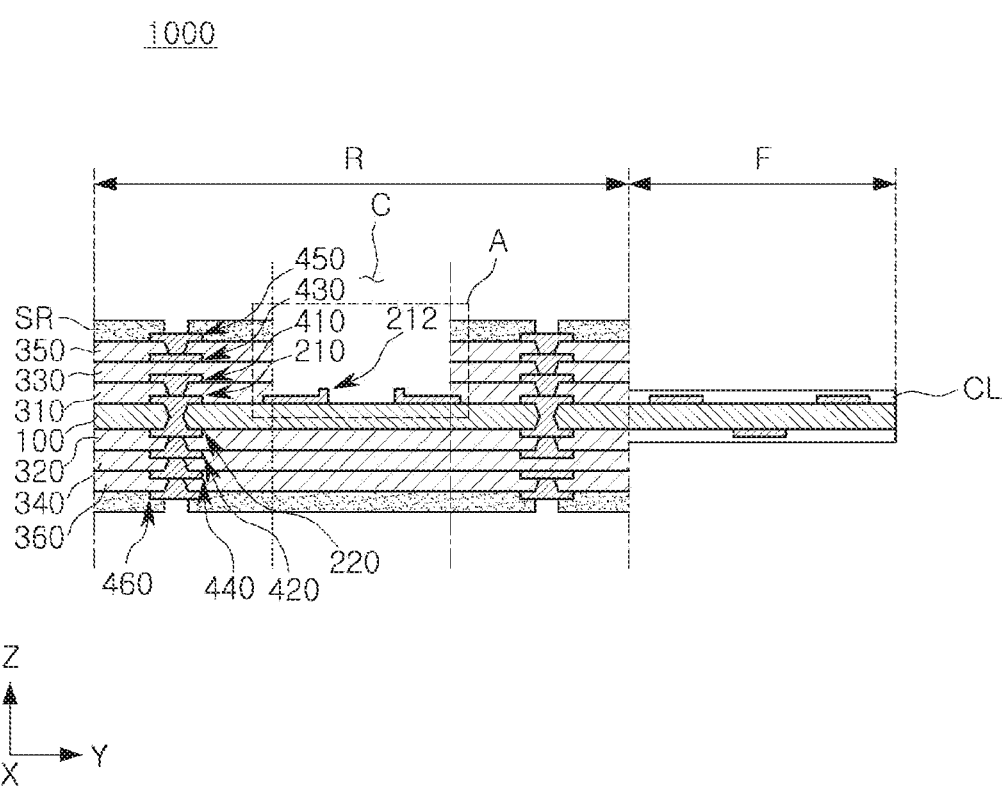
FIG. 1 is a cross-sectional side view schematically illustrating a printed circuit board according to an embodiment of the present disclosure.

The terms used in the description of the present disclosure are used to describe specific embodiments and are not intended to limit the present disclosure. A singular term may include a plural form unless otherwise indicated. The terms "include," "comprise," "is configured to," and the like, of the description of the present disclosure, are used to indicate the presence of features, numbers, steps, operations, elements, parts, or combination thereof, and do not exclude the possibilities of combination or addition of one or more additional features, numbers, steps, operations, elements, parts, or combination thereof. Also, the terms "disposed on," "positioned on," and the like, may indicate that an element is positioned on or beneath an object, and does not necessarily mean that the element is positioned above the object with reference to a gravity direction.

The term "coupled to," "combined to," and the like, may not only indicate that elements are directly and physically in contact with each other, but also include the configuration in which another element is interposed between the elements such that the elements are also in contact with the other component.

Sizes and thicknesses of elements illustrated in the drawings are indicated as examples for ease of description, and the present disclosure are not limited thereto.

In the drawings, an X direction refers to a first direction, a W direction (or Y direction) refers to a second direction, and a T direction (or Z direction) refers to a third direction.

Hereinafter, a printed circuit board according to an embodiment of the present disclosure will be described in detail with reference to the accompanying drawings. Referring to the accompanying drawings, the same or corresponding components may be denoted by the same reference numerals, and overlapped descriptions will be omitted.

First Embodiment

Figure 2:
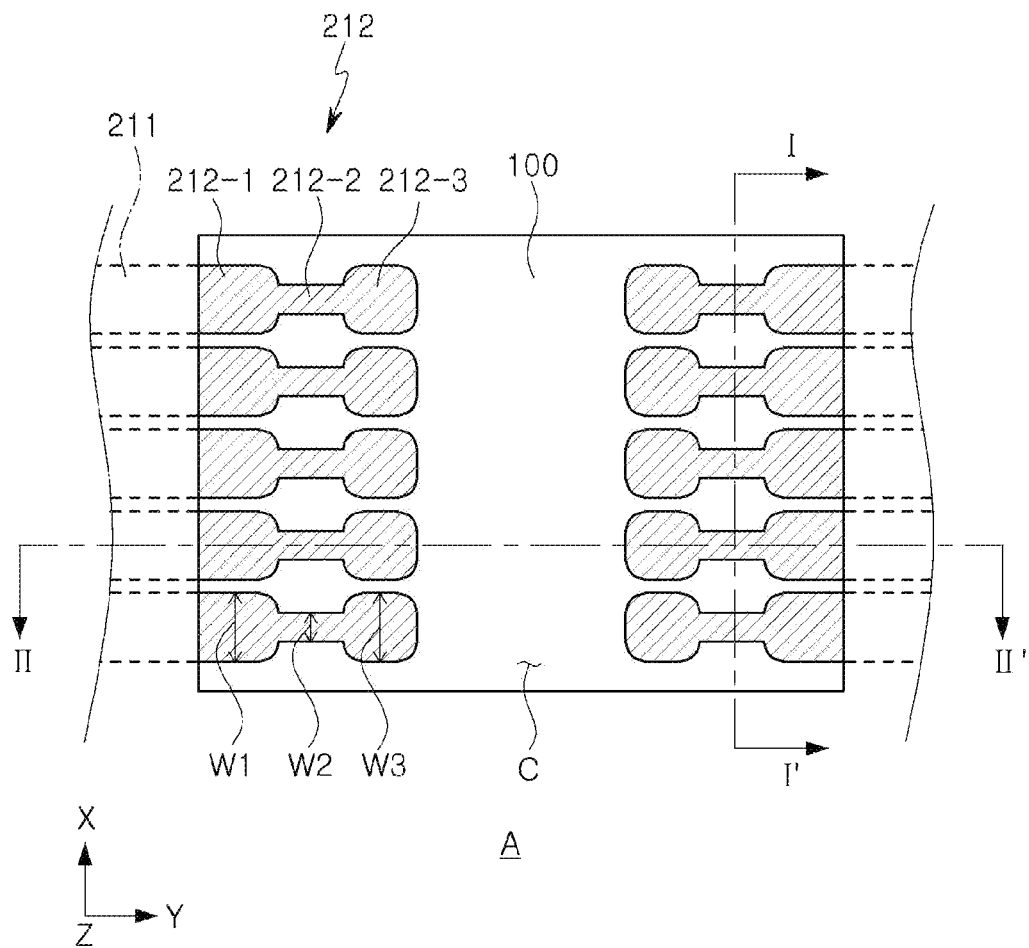
FIG. 2 is a view schematically illustrating portion A of FIG. 1, as viewed from above in a downward direction.
Figure 3:
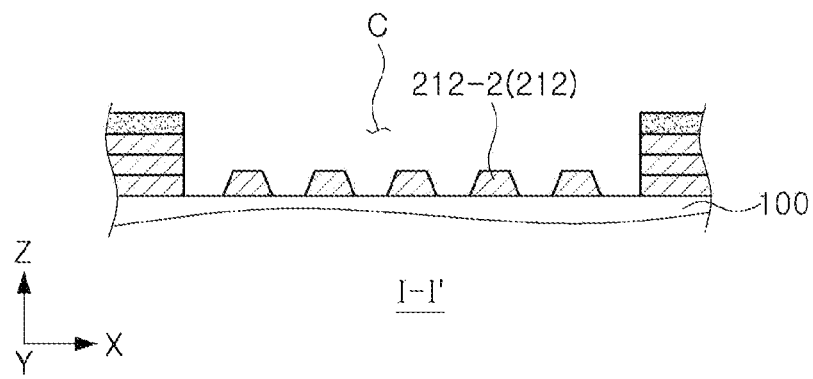
FIG. 3 is a cross-sectional view taken along line I-I' of FIG. 2.
Figure 4:
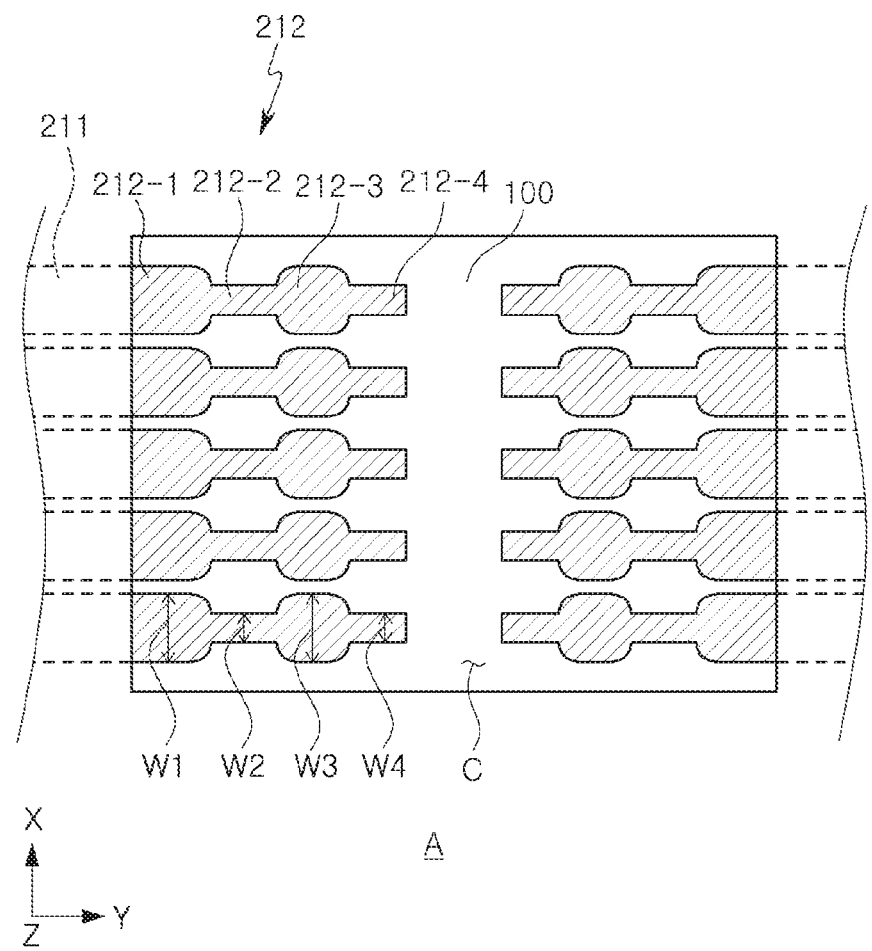
FIG. 4 is a view schematically illustrating a modification of portion A of FIG. 1, corresponding to FIG. 2.

FIG. 1 is a side cross-sectional view schematically illustrating a printed circuit board according to an embodiment of the present disclosure. FIG. 2 is a view schematically illustrating portion A of FIG. 1, as viewed in a downward direction. FIG. 3 is a cross-sectional view taken along line I-I' of FIG. 2. FIG. 4 is a view schematically illustrating a modification of portion A of FIG. 1, corresponding to FIG. 2.

Referring to FIGS. 1 to 4, a printed circuit board 1000 according to an embodiment of the present disclosure may include an internal insulating layer 100, an internal conductive pattern layer 210 or 220, an external insulating layer 310, 320, 330, 340, 350, or 360, and an accommodation groove C, and may further include an external conductive pattern layer 410, 420, 430, 440, 450, or 460, a protective layer SR, and a coverlay CL.

The internal insulating layer 100 may include a flexible region F and a rigid region R. For example, the internal insulating layer 100 may be continuously formed in the flexible region F and the rigid region R. The internal insulating layer 100 may be integrally formed in the flexible region F and the rigid region R.

In this regard, the printed circuit board 1000 according to the present disclosure may be distinguished from a rigid flexible printed circuit board manufactured by separately preparing a rigid printed circuit board and a flexible printed circuit board and bonding both thereof in a soldering process, or the like.

Referring to FIG. 1, the flexible region F and the rigid region R may refer to separate partial regions of the printed circuit board 1000 according to this embodiment. Therefore, the internal insulating layer 100 itself may not have the flexible region F and the rigid region R. For convenience of description, the internal insulating layer 100 will also be described by using the flexible region F and the rigid region R, which may be partial regions of the printed circuit board 1000 of this embodiment. Therefore, the flexible region F of the internal insulating layer 100 may refer to a portion of the internal insulating layer 100 corresponding to the flexible region F of the printed circuit board 1000. Similarly, the rigid region R of the internal insulating layer 100 may refer to another portion of the internal insulating layer 100 corresponding to the rigid region R of the printed circuit board 1000. The printed circuit board 1000 according to this embodiment may be a rigid flexible printed circuit board.

The internal insulating layer 100 may be formed of a polyimide (PI) film, but is not limited thereto. For example, any flexible electrical insulating material maybe used as the internal insulating layer 100 applied to this embodiment without limitation. The internal insulating layer 100 may be formed using a flexible copper clad laminate (FCCL) having a metal film such as a copper film attached to at least one surface of the flexible insulating film, but is not limited thereto.

The internal conductive pattern layer 210 or 220 may be disposed on the internal insulating layer 100, and may include a line portion 211 and a bonding pad portion 212. In particular, the first and second internal conductive pattern layers 210 and 220 may be formed on both surfaces of the internal insulating layer 100 opposing or facing each other. Each of the first and second internal conductive pattern layers 210 and 220 may be formed in the flexible region F and the rigid region R of the internal insulating layer 100, but are not limited thereto. A via passing through the internal insulating layer 100 may be formed in the internal insulating layer 100 to connect the internal conductive pattern layers 210 and 220. The via may be formed by forming a via hole in the internal insulating layer 100, and forming a conductive layer along an internal wall of the via hole, or filling a conductive material in the via hole. The first internal conductive pattern layer 210 may include the line portion 211, and the bonding pad portion 212 connected to the line portion 211 and exposed to the accommodation groove C, which will be described later.

The internal conductive pattern layers 210 and 220 may be formed by a method of forming a conductive pattern, such as a subtractive process, an additive process (AP), a semi-additive process, a modified semi-additive process (MSAP), or the like. Referring to FIG. 3, when the bonding pad portion 212 is formed by the subtractive process, the bonding pad portion 212 may be formed to have an area of a lower portion larger than an area of an upper portion.

The external insulating layers 310, 320, 330, 340, 350, and 360 may be disposed on the internal insulating layer 100 and the internal conductive pattern layers 210 and 220. In this embodiment, the external insulating layers 310, 320, 330, 340, 350, and 360 may be disposed only in the rigid region R of the internal insulating layer 100. In this sense, the external insulating layers 310, 320, 330, 340, 350, and 360 may be have openings formed therein corresponding to the flexible region F.

Since the external insulating layers 310, 320, 330, 340, 350, and 360 are only formed in the rigid region R of the internal insulating layer 100, the printed circuit board 1000 according to this embodiment may have rigidity in the rigid region R, and may have flexibility in the flexible region F.

The plurality of external insulating layers 310, 320, 330, 340, 350, and 360 may be formed on both surfaces of the internal insulating layer 100. For example, based on the directions of FIG. 1, a first external insulating layer 310, a third external insulating layer 330, and a fifth external insulating layer 350 may be sequentially formed on an upper surface of the internal insulating layer 100 in the Z direction. In addition, based on the directions of FIG. 1, a second external insulating layer 320, a fourth external insulating layer 340, and a sixth external insulating layer 360 may be sequentially formed on a lower surface of the internal insulating layer 100 in the Z direction. Hereinafter, unless it is necessary to distinguish each of the first to sixth external insulating layers 310, 320, 330, 340, 350, and 360, the external insulating layers 310, 320, 330, 340, 350, and 360 will be collectively described.

Since the number of the external insulating layers 310, 320, 330, 340, 350, and 360 illustrated in FIG. 1, and the like, may be merely illustrative, the number of the external insulating layers 310, 320, 330, 340, 350, and 360 respectively stacked on both surfaces of the internal insulating layer 100 may be variously changed according to design requirements, and the like.

The external insulating layers 310, 320, 330, 340, 350, and 360 may be formed of prepreg (PPG) containing an insulating resin such as an epoxy resin. Alternatively, the external insulating layers 310, 320, 330, 340, 350, and 360 may be formed of a buildup film such as an Ajinomoto build-up film (ABF) including an insulating resin such as an epoxy resin. Alternatively, the external insulating layers 310, 320, 330, 340, 350, and 360 may be photosensitive insulating layers including photosensitive electrically insulating resins. Alternatively, the external insulating layers 310, 320, 330, 340, 350, and 360 may be flexible insulating layers.

The external insulating layers 310, 320, 330, 340, 350, and 360 may include a reinforcing material contained in the electrically insulating resin. The reinforcing material may be at least one of glass cloth, glass fiber, inorganic filler, and organic filler. The reinforcing material may reinforce the rigidity of the external insulating layers 310, 320, 330, 340, 350, and 360, and may lower a coefficient of thermal expansion thereof.

As the inorganic filler, at least one or more selected from a group consisting of silica ($SiO_2$), alumina ($Al_2O_3$), silicon carbide (SiC), barium sulfate ($BaSO_4$), talc, mud, a mica powder, aluminum hydroxide ($Al(OH)_3$), magnesium hydroxide ($Mg(OH)_2$) calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$) may be used.

The external insulating layers 310, 320, 330, 340, 350, and 360 applied to this embodiment may be formed by appropriately mixing a low-flow type prepreg and a general prepreg. For example, any one of the external insulating layers 310, 320, 330, 340, 350, and 360 may be formed by sequentially stacking the low-flow type prepreg and the general prepreg. However, the above descriptions are merely illustrative.

For example, the external insulating layers 310, 320, 330, 340, 350, and 360 may be stacked on the internal insulating layer 100 after processing an insulating material for forming the external insulating layer into a shape corresponding to the rigid region R. Alternatively, the external insulating layers 310, 320, 330, 340, 350, and 360 may only be disposed in the rigid region R of the internal insulating layer 100 by stacking an insulating material covering the rigid region R and the flexible region F on the internal insulating layer 100, and then only removing the insulating material in a region corresponding to the flexible region F. In the latter method, the above-described removal process may be performed after formation of every layer of the plurality of external insulating layers 310, 320, 330, 340, 350, and 360 as they are sequentially formed, or may be performed by forming all of the plurality of external insulating layers 310, 320, 330, 340, 350, and 360 and then collectively removing a region corresponding to the flexible region F among the plurality of external insulating layers 310, 320, 330, 340, 350, and 360.

The accommodation groove C may pass through the first, third, and fifth external insulating layers 310, 330, and 350 to expose the bonding pad portion 212. Therefore, the bonding pad portion 212 of the first internal conductive pattern layer 210 and one surface of the internal insulating layer 100 may be exposed to the outside by the accommodation groove C. The accommodation groove C may also pass through the protective layer SR to be described later. The accommodation groove C may be a space in which active electronic components or passive electronic components are arranged and/or mounted, and may be formed in the first, third, and fifth external insulating layers 310, 330, and 350 in a size corresponding to sizes of the electronic components to be arranged or mounted.

As described above, the first internal conductive pattern layer 210 may include the line portion 211 and the bonding pad portion 212. The bonding pad portion 212 may include a connection pattern 212-1 extending from the line portion 211 of the internal conductive pattern layer 210 embedded in the first external insulating layer 310, and exposed to the accommodation groove C; a land pattern 212-3 disposed closer to a center portion of the accommodation groove C than the connection pattern 212-1; and a dam pattern 212-2 connecting the connection pattern 212-1 and the land pattern 212-3, in which a line width (W2) of the dam pattern 212-2 is narrower than a line width (W3) of the land pattern 212-3. Referring to FIG. 2, the connection pattern 212-1, the dam pattern 212-2, and the land pattern 212-3 may be sequentially disposed in the Y direction.

The land pattern 212-3 of the bonding pad portion 212 may be connected to the electronic component disposed in the accommodation groove C by the thermal compression (TC) bonding process. In this case, a metal bump of the electronic component and the land pattern 212-3 may be connected to each other through a solder. In general, a TC bonding pad on a board may be formed in a bar type, and solder flow may occur in a conductive region, other than a land pattern, during a solder reflow process, and when an amount of a solder flowing into the conductive region, other than the land pattern, is high, a phenomenon in which an alignment between the metal bump and the land pattern is distorted may occur. In the present disclosure, the above-described phenomenon may be reduced by making the line width (W2) of the dam pattern 212-2 narrower than the line width (W3) of the land pattern 212-3. For example, in the case of the present disclosure, the bonding pad portion 212 may be formed in the form of a bar as a whole, similar to the prior art, but the line width (W2) of the dam pattern 212-2 is narrower than the line width (W3) of the land pattern 212-3. Therefore, the solder flow generated from the land pattern 212-3 to the dam pattern 212-2 may be reduced during the solder reflow process. For example, the solder flow in the Y direction of FIG. 2 may be reduced. As a result, in the solder reflow process, the phenomenon in which the alignment between the metal bump and the land pattern 212-3 is distorted may be reduced.

When the bonding pad portion 212 is formed in plural by the subtractive process, a variation in line width between the plurality of bonding pad portions 212 may be relatively large. In this case, even when the same volume of solder may be used for each of the bonding pad portions 212, a variation in solder flow in each of the bonding pad portions 212 may be relatively large, and may thereby deteriorate reliability for connection between the metal bumps and the plurality of bonding pad portions 212. In the present disclosure, even when the bonding pad portion 212 is formed by the subtractive process, the above-described phenomenon may be prevented by reducing the variation between solder reflow processes generated for each of the bonding pad portions 212 due to the dam pattern 212-2. For example, even when the variation in line width of the plurality of bonding pad portions 212 is relatively large due to the subtractive method, an amount of solder reflow itself in each of the bonding pad portions 212 may be reduced, due to the dam pattern 212-2 formed with a line width (W2) narrower than the line width (W3) of the land pattern 212-3. Therefore, a variation in volume of a residual solder connecting the land pattern 212-3 and the metal bump may be reduced.

The line width (W2) of the dam pattern 212-2 may be narrower than a line width (W1) of the connection pattern 212-1. The connection pattern 212-1 may be embedded in the first external insulating layer 310 to extend from the line portion 211, which is not exposed to the accommodation groove C, to have the same line width as the line portion 211. The line width (W1) of the pattern 212-1 may be formed to be wider than the line width (W2) of the dam pattern 212-2, to minimize an increase in resistance during signal transmission, and minimize a decrease in bonding force between the first internal conductive pattern layer 210 and the internal insulating layer 100. For example, in order to minimize the solder flow in the bonding pad portion 212, an area of a region formed with a relatively narrow line width may be minimized to significantly reduce side effects caused by this.

Figure 6:
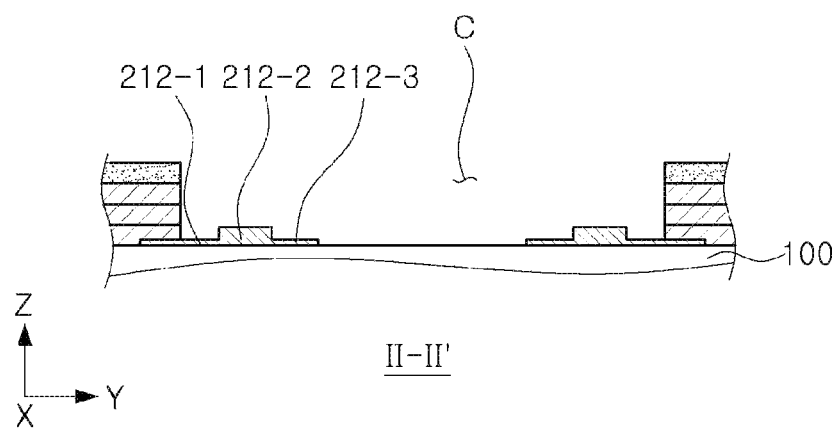
FIG. 6 is a cross-sectional view taken along line II-II' of FIG. 2.

A thickness of at least one of the land pattern 212-3 and the dam pattern 212-2 may be thicker than a thickness of the connection pattern 212-1. In order to minimize the volume of the solder used in the above-described TC bonding process, the land pattern 212-3 may be formed to have a thickness thicker than the connection pattern 212-1. Due to the land pattern 212-3 having a relatively thick thickness and the metal bump of the electronic component, the amount of solder used for connecting the two during the TC bonding process may be reduced. As shown in FIG. 6, the dam pattern 212-2 may also be formed to have a thickness thicker than that of the connection pattern 212-1 according to design requirements, and the like.

For example, the line widths (W1, W2, and W3) of the connection pattern 212-1, the dam pattern 212-2, and the land pattern 212-3 may be 30 μm, 15 μm, and 25 μm, respectively, but the present disclosure is not limited thereto. In addition, the numerical values mentioned above may be numerical values which do not reflect tolerances in the process, and even when the numerical values mentioned above have numerical values different from the above numerical values, the numerical values recognized as a range corresponding to the tolerances in the process may fall within the scope of the present disclosure.

Referring to FIG. 2, the bonding pad portion 212 may be formed, in plural, to be spaced apart from each other in the accommodation groove C. In particular, the bonding pad portion 212 may include a first bonding pad portion 212 disposed on a left side of the accommodation groove C, and a second bonding pad portion 212 disposed on a right side of the accommodation groove C, with reference to FIG. 2. The first and second bonding pad portions 212 may be spaced apart from each other in the Y-direction of FIG. 2, and each of the land patterns 212-3 may be arranged to face each other. In this case, each of the first bonding pad portion 212 and the second bonding pad portion 212 may be formed, in plural, to be spaced apart from each other in the X direction, perpendicular to the Y direction. FIG. 2 illustrates a total of 10 bonding pad portions 212, but this is merely illustrative, and the number of bonding pad portions 212 may be changed according to the number of metal bumps of an electronic component.

Referring to FIG. 4, in a modification of this embodiment, the bonding pad portion 212 may further include an auxiliary dam pattern 212-4 extending from the land pattern 212-3 to the central portion of the accommodation groove C, in which a line width (W4) is narrower than the line width (W3) of the land pattern 212-3. In this modification, the bonding pad portion 212 may have the connection pattern 212-1, the dam pattern 212-2, the land pattern 212-3, and the auxiliary dam pattern 212-4, sequentially arranged in the Y-direction of FIG. 4. In this modification, since the dam pattern 212-2 and the auxiliary dam pattern 212-4 having the line widths narrower than the land pattern 212-3 and are formed on opposing sides (e.g., on one side and the other side) of the land pattern 212-3, the above effect due to the dam pattern 212-2 may be improved. The line width (W4) of the auxiliary dam pattern 212-4 may be substantially the same as the line width (W2) of the dam pattern 212-2, but is not limited thereto.

The printed circuit board 1000 according to this embodiment may further include the external conductive pattern layer 410, 420, 430, 440, 450, or 460 disposed on the external insulating layer 310, 320, 330, 340, 350, or 360, and, in addition, may include a via passing through the external insulating layer 310, 320, 330, 340, 350, or 360 to connect adjacent external conductive pattern layer 410, 420, 430, 440, 450, or 460 to each other.

Each of the internal conductive pattern layer 210 or 220, the external conductive pattern layer 410, 420, 430, 440, 450, or 460, and the via may be formed of copper (Cu), silver (Ag), palladium (Pd), aluminum (Al), nickel (Ni), titanium (Ti), gold (Au), platinum (Pt), or the like, having excellent electrical characteristics. The internal conductive pattern layer 210 or 220, the external conductive pattern layer 410, 420, 430, 440, 450, or 460, and the via may each include an electroless copper plating layer as a seed layer. Each of the internal conductive pattern layer 210 or 220, the external conductive pattern layer 410, 420, 430, 440, 450, or 460, and the via may further include a metal film layer, such as a copper film, as another seed layer.

The printed circuit board 1000 according to this embodiment may further include the protective layer SR and the coverlay CL. The protective layer SR may protect the external conductive pattern layers 450 and 460, which are outermost layers formed in the rigid region R. The coverlay CL may protect an outermost conductive pattern layer formed in the flexible region F. The protective layer SR may be a photosensitive insulating material such as a solder resist or the like, but is not limited thereto. The coverlay CL may include a flexible insulating material such as polyimide or the like, but is not limited thereto. As described above, in this embodiment, since the external insulating layers 310, 320, 330, 340, 350, and 360 may be disposed only in the rigid region R, the outermost conductive pattern layer formed in the flexible region F may correspond to the internal conductive pattern layer 210 or 220 described above. Specifically, based on FIG. 1, the protective layer SR may be formed on the fifth external insulating layer 350 and the sixth external insulating layer 360 to protect the fifth external conductive pattern layer 450 and the sixth external conductive pattern layer 460, respectively. Based on FIG. 1, the coverlay CL may be formed on both sides of the internal insulating layer 100, to protect a portion of the first internal conductive pattern layer 210 formed in the flexible region F and a portion of the second internal conductive pattern layer 220 formed in the flexible region F. An opening may be formed in the protective layer SR to expose at least a portion of the outermost conductive pattern layer.

In FIG. 1, the coverlay CL is illustrated to be only formed in the flexible region F of the internal insulating layer 100. Since the coverlay CL above mentioned is only illustrative, the coverlay CL may be disposed on at least a portion of the rigid region R of the internal insulating layer 100, in a different manner to FIG. 1. In addition, FIG. 1 illustrates that the external insulating layers 310, 320, 330, 340, 350, and 360 are rigid insulating layers, but when the external insulating layers 310, 320, 330, 340, 350, and 360, as described above, are formed of a flexible insulating film such as a polyimide film, a coverlay, an adhesive layer, or the like, may be additionally disposed between adjacent external insulating layers.

Another Embodiment

Figure 5:
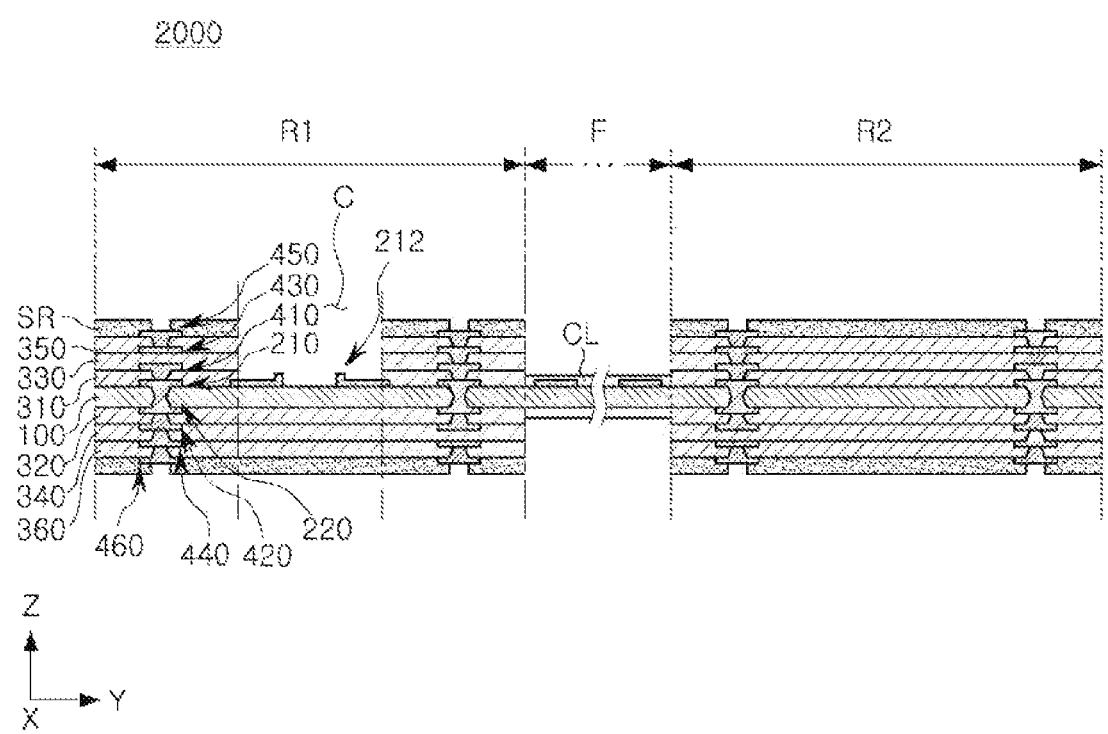
FIG. 5 is a cross-sectional side view schematically illustrating a printed circuit board according to another embodiment of the present disclosure.

FIG. 5 is a view schematically illustrating a printed circuit board according to another embodiment of the present disclosure. Referring to FIGS. 1 to 4 and FIG. 5, a printed circuit board 2000 according to another embodiment of the present disclosure may be different from the printed circuit board 1000 according to the first embodiment of the present disclosure, in view of the fact that rigid regions R1 and R2 of an internal insulating layer may be present.

Therefore, in describing this embodiment, only the rigid regions R1 and R2 of the internal insulating layer will be described. Other configurations applied to this embodiment may be applied as it is in the first embodiment of the present disclosure.

Referring to FIG. 5, an internal insulating layer 100 applied to this embodiment may include a flexible region F, a first rigid region R1 disposed on one side of the flexible region F, and a second rigid region R2 disposed on another side of the flexible region F. An external insulating layer 310, 320, 330, 340, 350, or 360 may be disposed in each of the first and second rigid regions R1 and R2. Since the external insulating layers 310, 320, 330, 340, 350, and 360 may only be disposed in the first and second rigid regions R1 and R2 of the internal insulating layer 100, the flexible region F of the internal insulating layer 100 may be exposed. Since portions of each of the external insulating layers 310, 320, 330, 340, 350, and 360 disposed in the first rigid region R1, and portions of each of the external insulating layers 310, 320, 330, 340, 350, and 360 disposed in the second rigid region R2 may be arranged in a form completely separated from each other, the two portions may be not be physically and/or directly connected to each other.

The printed circuit board 2000 according to this embodiment may be a rigid flexible printed circuit board, divided into the first rigid region R1, the flexible region F, and the second rigid region R3, as above described.

In the above description, the printed circuit board according to the present disclosure has been described that the rigid flexible printed circuit board is divided into the rigid regions R (e.g., R1 and R2) and the flexible region F, but is merely illustrative. For example, the printed circuit board according to another embodiment of the present disclosure may be a rigid printed circuit board formed using a conventional rigid insulating layer. In this case, the internal insulating layer 100 described above may be a rigid insulating layer such as a prepreg or the like, not a flexible insulating layer such as polyimide or the like. In this case, the above-described external insulating layers 310, 320, 330, 340, 350, and 360 may not only be formed in a portion of the internal insulating layer 100, but also be formed to cover the entire region of the internal insulating layer 100.

According to the present disclosure, the reliability for connection between the printed circuit board and the electronic component may be improved.

While example embodiments have been illustrated and described above, it will be apparent to those skilled in the art that modifications and variations could be made without departing from the scope of the present disclosure as defined by the appended claims.

What is claimed is:

1. A printed circuit board comprising:
an internal insulating layer;
an internal conductive pattern layer disposed on the internal insulating layer, and including a line portion and a bonding pad portion; and
an external insulating layer disposed on the internal conductive pattern layer and the internal insulating layer, and having an accommodation groove extending through the external insulating layer to expose the bonding pad portion,
wherein the bonding pad portion comprises:
a connection pattern extending from the line portion of the internal conductive pattern layer embedded in the external insulating layer, and extending in the accommodation groove;
a land pattern disposed closer to a center portion of the accommodation groove than the connection pattern; and
a dam pattern connecting the connection pattern and the land pattern, in which a line width of the dam pattern is narrower than a line width of the land pattern, and
wherein a thickness of the dam pattern is thicker than a thickness of the connection pattern.

2. The printed circuit board according to claim 1, wherein the line width of the dam pattern is narrower than a line width of the connection pattern.

3. The printed circuit board according to claim 1, wherein a thickness of the land pattern is thicker than the thickness of the connection pattern.

4. The printed circuit board according to claim 1, wherein a line width of the line portion is equal to a line width of the connection pattern.

5. The printed circuit board according to claim 1, wherein the internal conductive pattern layer includes a plurality of bonding pad portions spaced apart from each other in the accommodation groove and including the bonding pad portion.

6. The printed circuit board according to claim 1, wherein the external insulating layer extends on first and second sides of the accommodating groove opposing each other in a first direction, and the bonding pad portion comprises a first plurality of bonding pad portions disposed on the first side of the accommodation groove and a second plurality of bonding pad portions disposed on the opposing second side of the accommodation groove and facing the first bonding pad portions,
wherein each of the first bonding pad portions are spaced apart from each other in a second direction perpendicular to the first direction, and each of the second bonding pad portions are spaced apart from each other in the second direction perpendicular to the first direction.

7. The printed circuit board according to claim 1, wherein the bonding pad portion further comprises an auxiliary dam pattern extending from the land pattern towards the center portion of the accommodation groove, in which a line width of the auxiliary dam pattern is narrower than the line width of the land pattern.

8. The printed circuit board according to claim 1, further comprising:
an external conductive pattern layer disposed on the external insulating layer; and
a protective layer disposed on the external insulating layer to protect the external conductive pattern layer.

9. The printed circuit board according to claim 1, wherein the internal insulating layer comprises a flexible region and a rigid region, and
wherein the external insulating layer is disposed only in the rigid region of the internal insulating layer.

10. The printed circuit board according to claim 9, wherein the bonding pad portion has a first surface in contact with the internal insulating layer, and a second surface opposing the first surface, wherein an area of the first surface of the bonding pad portion is larger than an area of the second surface of the bonding pad portion.

11. The printed circuit board according to claim 9, wherein the rigid region comprises first and second rigid regions disposed on opposite sides of the flexible region,
wherein the external insulating layer is disposed only in each of the first and second rigid regions of the internal insulating layer, from among the first and second rigid regions and the flexible region of the internal insulating layer.

12. A printed circuit board comprising an internal insulating layer including a flexible region and a rigid region, and an external insulating layer disposed in the rigid region, comprising:
an internal conductive pattern layer disposed on the internal insulating layer, and including a line portion and a bonding pad portion both disposed in the rigid region,
wherein the external insulating layer has an accommodation groove passing therethrough to expose the bonding pad portion,
wherein the bonding pad portion comprises one region disposed in a central portion of the accommodation groove, and another region extending from the one region to be connected to the line portion, in which at least a portion of a line width of the another region of the bonding pad portion is narrower than a line width of the one region of the bonding pad portion,
wherein the one region of the bonding pad portion is thicker than the another region of the bonding pad portion, and
wherein the another region of the bonding pad portion includes a connection pattern connected to the line portion and a dam pattern connecting the connection pattern and the one region of the bonding pad portion, the dam pattern is thicker than the connection pattern.

13. The printed circuit board of claim 12, wherein the another region of the bonding pad portion includes a connection pattern having a line width equal to the line portion embedded in the external insulating layer, and a dam pattern connecting the connection pattern and the one region of the bonding pad portion and having a line width narrower than the line width of the connection pattern.

14. The printed circuit board of claim 12, wherein the accommodation groove and the bonding pad portion are spaced apart from the flexible region of the internal insulating layer.

15. A printed circuit board comprising:
a first insulating layer;
a conductive pattern disposed on the first insulating layer; and
a second insulating layer disposed on the conductive pattern and the first insulating layer,
wherein a bonding pad portion of the conductive pattern is exposed through an opening in the second insulating layer, and
the bonding pad portion of the conductive pattern includes:
a connection pattern extending in the opening in the second insulating layer from the conductive pattern layer embedded in the second insulating layer;
a land pattern disposed closer to a center portion of the opening in the second insulating layer than the connection pattern; and
a dam pattern connecting the connection pattern and the land pattern and having a line width narrower than a line width of the connection pattern, and
wherein the dam pattern is thicker than the connection pattern.

16. The printed circuit board of claim 15, wherein the line width of the dam pattern is narrower than a line width of the land pattern.

17. The printed circuit board of claim 15, wherein the land pattern is thicker than the connection pattern.

18. The printed circuit board of claim 15, wherein the bonding pad portion further includes an auxiliary dam pattern extending from the land pattern towards the center portion of the opening, in which a line width of the auxiliary dam pattern is narrower than a line width of the land pattern.

19. The printed circuit board of claim 15, wherein the printed circuit board comprises a flexible region and a rigid region, and
the bonding pad portion of the conductive pattern is disposed in the rigid region and spaced apart from the flexible region of the printed circuit board.

* * * * *